(12) United States Patent
Huang et al.

(10) Patent No.: US 12,224,730 B2
(45) Date of Patent: Feb. 11, 2025

(54) MANUFACTURING METHOD OF A COMPOSITE SUBSTRATE OF AN ACOUSTIC WAVE RESONATOR (71) Applicant: NINGBO SEMICONDUCTOR INTERNATIONAL CORPORATION, Zhejiang (CN)

(72) Inventors: Herb He Huang, Zhejiang (CN); Hailong Luo, Zhejiang (CN); Wei Li, Zhejiang (CN); Fei Qi, Zhejiang (CN)

(73) Assignee: NINGBO SEMICONDUCTOR INTERNATIONAL CORPORATION, Zhejiang (CN)

( * ) Notice: Subject to any disclaimer, the term of this patent is extended or adjusted under 35 U.S.C. 154(b) by 467 days.

(21) Appl. No.: 17/618,690

(22) PCT Filed: Jul. 1, 2020

(86) PCT No.: PCT/CN2020/099638
§ 371 (c)(1),
(2) Date: Dec. 13, 2021

(87) PCT Pub. No.: WO2021/139117
PCT Pub. Date: Jul. 15, 2021

(65) Prior Publication Data
US 2022/0247375 A1 Aug. 4, 2022

(30) Foreign Application Priority Data
Jan. 8, 2020 (CN) .......................... 202010018484.8

(51) Int. Cl.
*H03H 3/08* (2006.01)
*H03H 9/25* (2006.01)

(52) U.S. Cl.
CPC ................ *H03H 3/08* (2013.01); *H03H 9/25* (2013.01)

(58) Field of Classification Search
CPC ...... H03H 9/02834; H03H 9/145; H03H 9/25; H03H 9/6483; H03H 3/08; H03H 9/02559;
(Continued)

(56) References Cited

U.S. PATENT DOCUMENTS

| 4,792,843 | A | * | 12/1988 | Haghiri-Tehrani | ......................... H01L 23/49855 257/679 |
| 6,201,457 | B1 | * | 3/2001 | Hickernell | ........... H03H 9/6409 333/195 |
| 6,495,914 | B1 | * | 12/2002 | Sekine | .................... H01L 25/50 257/E21.705 |

(Continued)

FOREIGN PATENT DOCUMENTS

| CN | 102034799 A | 4/2011 |
| CN | 103840075 A | 6/2014 |

(Continued)

*Primary Examiner* — Donghai D Nguyen
(74) *Attorney, Agent, or Firm* — FISHERBROYLES, LLP; Roger L. Browdy; Ronni S. Jillions (57) ABSTRACT

The present invention discloses a composite substrate for manufacturing an acoustic wave resonator and a Surface Acoustic Wave (SAW) resonator, and a manufacturing method thereof. The manufacturing method of the composite substrate includes: providing a base, wherein the base includes a first surface and a second surface that are opposite to each other; and a first groove sunken towards the second surface is formed on the first surface; and providing a piezoelectric plate, wherein the piezoelectric plate is matched with the first groove in shape, and a bottom of the first groove is integrated with the piezoelectric plate by bonding; and the composite substrate includes: a base, wherein the base includes a first surface and a second surface that are opposite to each other; and a first groove sunken towards the second surface is provided on the first surface; and a piezoelectric plate, wherein the piezoelectric plate is embedded into the first groove, and a top of the piezoelectric plate is higher than the first surface or flush with the first surface.

12 Claims, 4 Drawing Sheets (58) Field of Classification Search
CPC ............... H03H 9/02574; H01L 23/66; H01L 23/49855; H01L 25/50; Y10T 29/42; Y10T 29/4913; Y10T 29/49146
See application file for complete search history.

(56) References Cited

U.S. PATENT DOCUMENTS

| | | | |
|---|---|---|---|
| 7,518,229 B2 * | 4/2009 | Cotte | ............... H01L 23/66 |
| | | | 257/E25.011 |
| 2014/0141546 A1 | 5/2014 | Cho | |
| 2019/0149129 A1 | 5/2019 | Ueda | |

FOREIGN PATENT DOCUMENTS

| | | |
|---|---|---|
| CN | 203851109 A | 9/2014 |
| CN | 105958956 A | 9/2016 |
| CN | 107408936 A | 11/2017 |
| CN | 108028636 A | 5/2018 |
| CN | 108494380 A | 9/2018 |
| CN | 109273586 A | 1/2019 |
| IN | 110011631 A | 7/2019 |
| JP | 2006340007 A | 12/2006 |
| JP | 2009246583 A | 10/2009 |
| JP | 2010050736 A | 3/2010 |
| JP | 2010536217 A | 11/2010 |
| JP | 2015162905 A | 9/2015 |
| JP | 2017224890 A | 12/2017 |
| JP | 2018537672 A | 12/2018 |
| JP | 2019092096 A | 6/2019 |
| WO | 2013031748 A1 | 3/2013 |
| WO | 2017068828 A1 | 4/2017 |

\* cited by examiner

MANUFACTURING METHOD OF A COMPOSITE SUBSTRATE OF AN ACOUSTIC WAVE RESONATOR

FIELD OF TECHNOLOGY

The present invention relates to the field of semiconductor manufacturing, and more particularly, to a composite substrate for manufacturing an acoustic wave resonator and a Surface Acoustic Wave (SAW) resonator, and a manufacturing method thereof.

BACKGROUND

With the development of mobile communication technologies, the transmitted traffic of mobile data also rises rapidly. Hence, while the frequency resources are limited and the mobile communication devices should be used as few as possible, to improve the transmitting power such wireless power transmitting devices as the wireless base station, micro base station or repeater has become a problem to be considered necessarily. Meanwhile, it also means that increasingly higher requirements are put forward on the power of a filter in the front-end circuit of the mobile communication device. The lithium tantalate or lithium niobate is widely used as a piezoelectric material of the SAW device.

As an elastic wave, the SAW is produced and propagated on the surface of the piezoelectric plate and has the amplitude quickly decreased with the increase of a depth penetrated into the piezoelectric plate. The basic structure of the SAW filter is achieved by manufacturing, on a polished surface of the plate material with piezoelectric characteristics, two acoustoelectric transducers-Interdigital Transducers (IDTs) to respectively serve as a transmitting transducer and a receiving transducer. The transmitting transducer converts the Radio Frequency (RE) signal into the SAW to be propagated on the surface of the plate. With a certain delay, the receiving transducer converts the acoustic signal into the electrical signal to output. The filtration process is implemented in piezoelectric conversion from the electrical signal to the acoustic signal and from the acoustic signal to the electrical signal.

In existing solutions, the piezoelectric plate of the acoustic wave device is formed on the substrate. The piezoelectric plate falls off easily due to the insufficient bonding strength with the substrate; and additionally, the piezoelectric plate is damaged due to the transverse deformation, which is also a problem confronted at present.

Therefore, how to reinforce the bonding strength between the piezoelectric plate and the substrate, and prevent the damage problem of the piezoelectric plate due to the transverse deformation are the present research topics.

SUMMARY

An objective of the present invention is to provide a composite substrate for manufacturing an acoustic wave resonator and an SAW resonator, and a manufacturing method thereof, to solve the problems that when the piezoelectric plate is bonded with the substrate, the piezoelectric plate falls off due to the insufficient bonding strength and the piezoelectric plate is damaged due to the transverse deformation.

To achieve the above objective, the present invention provides a manufacturing method of a composite substrate, which includes:

providing a base, wherein the base includes a first surface and a second surface that are opposite to each other; and a first groove sunken towards the second surface is formed on the first surface; and providing a piezoelectric plate, wherein the piezoelectric plate is matched with the first groove in shape, and a bottom of the first groove is integrated with the piezoelectric plate by bonding.

The present invention further provides a manufacturing method of an SAW resonator, which uses the above composite substrate, and includes:

providing the composite substrate; and forming a first IDT and a second IDT on a top of a piezoelectric plate.

The present invention further provides a composite substrate, which includes:

a base, wherein the base includes a first surface and a second surface that are opposite to each other; and a first groove sunken towards the second surface is provided on the first surface; and a piezoelectric plate, wherein the piezoelectric plate is embedded into the first groove, and a top of the piezoelectric plate is higher than the first surface or flush with the first surface.

The present invention further provides an SAW resonator, which includes the above composite substrate.

The present invention has the following beneficial effects. By embedding the piezoelectric plate into the first groove, the sidewall of the first groove may obstruct the movement of the piezoelectric plate and prevent the piezoelectric plate from falling off, thereby improving the bonding strength. The first groove may further limit the transverse deformation of the piezoelectric plate, thereby reducing the damage risk of the piezoelectric plate due to the deformation. Additionally, the common practice for manufacturing the SAW resonator at present is to bond the piezoelectric plate on a silicon wafer of the same size. The silicon wafer typically has the specification of 12 inches, 8 inches and 6 inches. If the production line of the silicon wafer is the 8-inch production line, the 8-inch piezoelectric plate is used. The 6-inch piezoelectric plate is applied to the 6-inch production line, i.e., the 6-inch piezoelectric plate cannot be used by the 8-inch production line. The present invention may be applied to different specifications of production lines in a case where the specification of the piezoelectric plate is fixed.

Further, with the silicon dioxide layer, silicon and silicon nitride as the bonding layer, the bonding layer may be directly formed on the bottom of the piezoelectric plate or the first groove by deposition and thus is applied to the semiconductor process. Furthermore, the silicon dioxide layer may further serve as the temperature compensation layer of the piezoelectric plate.

Further, the stress buffering layer and the stress compensation layer are formed on the bottom of the first groove, the stress compensation layer is configured to offset a stress of the bonding layer, the stress buffering layer solves the problem of a large difference between stresses of the stress compensation layer and the base, and both the stress buffering layer and the stress compensation layer further have an acoustic reflection function and can reflect the acoustic wave to the piezoelectric plate to reduce the energy loss of the acoustic wave.

Further, a plurality of protrusions are arranged on the bottom of the first groove, and the second groove matched with the protrusion is provided on the bottom of the piezoelectric plate, such that the bonding strength between the piezoelectric plate and the base may be increased on one hand.

On the other hand, when the protrusion is slightly higher than the first surface, the protrusion may serve as the grinding stop layer so as to control the thickness of the piezoelectric plate.

Further, as the piezoelectric material is fragile and is prone to damage during cutting, when the protrusion made of the dielectric layer or silicon is distributed on the cutting channel, the piezoelectric material is prevented from being cut but the dielectric material such as the silicon nitride or silicon material is cut, and thus the damage problem of the piezoelectric substrate during cutting may be solved.

BRIEF DESCRIPTION OF THE DRAWINGS

FIG. 9A to FIG. 14 are a structural schematic diagram corresponding to different steps of a manufacturing method of a composite substrate according to a second embodiment of the present invention.

IN THE FIGURES

10-base, 101-first groove, 11-stress buffering layer, 12-stress compensation layer, 13-first bonding layer, 20-piezoelectric plate, 21-second bonding layer, 30-protrusion, and 31-second groove.

DESCRIPTION OF THE EMBODIMENTS

The present invention will be further described below in detail in combination with the accompanying drawings and the specific embodiments. According to the following description and the accompanying drawings, the advantages and features of the present invention will be clearer. However, it should be noted that the concept of the technical solution of the present invention may be implemented according to various different forms, and is not limited to the specific embodiments described herein. The accompanying drawings all adopt very simplified forms and use inaccurate scale, which are only used for conveniently and clearly assisting in describing the objective of the embodiment of the present invention.

It should be understood that when an element or layer is referred to as "on", "adjacent to", "connected to" or "coupled to" other elements or layers, the element or layer may be directly on, adjacent to, connected to or coupled to other elements or layers, or there may be an element or layer between the element or layer and other elements or layers. On the contrary, when an element is referred to as "directly on", "directly adjacent to", "directly connected to" or "directly coupled to" other elements or layers, there is no element or layer between the element or layer and other elements or layers. It should be understood that although terms first, second, third, etc. may be used to describe various elements, parts, regions, layers and/or portions, these elements, parts, regions, layers and/or portions should not be limited by these terms. These terms are only used to distinguish one element, part, region, layer or portion from another element, part, region, layer or portion. Therefore, without departing from the instruction of the present invention, a first element, part, region, layer or portion discussed below may be represented as a second element, part, region, layer or portion.

Spatial relationship terms such as "under", "below", "over", "above", etc. may be used herein for the convenience of description so as to describe a relationship between one element ore feature shown in the drawings and other elements or features. It should be understood that in addition to an orientation shown in the drawings, the spatial relationship terms are intended to further include different orientations of devices during use and operation. For example, if devices in the drawings are turned over, an element or feature which is described to be "below" or "under" other elements or features will be oriented to be "above" other elements or features. Therefore, exemplary terms "under" and "below" may include upper and lower orientations. Devices may be otherwise oriented (rotating by 90 degrees or adopting other orientations), and spatial description words used therein are accordingly explained.

The terms used herein are only intended to describe the specific embodiments and not to limit the present invention. When used herein, the singular forms "a", "an" and "the" are also intended to include the plural forms, unless the context clearly indicates otherwise. It should also be understood that terms "comprise" and/or "include", when used in the specification, are used to determine the presence of the feature, integer, step, operation, element and/or part, but do not exclude the presence or addition of more other features, integers, steps, operations, elements, parts and/or groups. When used herein, the term "and/or" includes any and all combinations of related listed items.

If the method of the present invention includes a series of steps, the order of these steps presented herein is not necessarily the only order in which these steps may be performed, and some steps may be omitted and/or some other steps not described herein may be added to the method. If elements in a certain drawing are as same as elements in other drawings, these elements may be easily identified, but in order to make the description of the drawings clearer, the description will not mark the reference numerals of all the same elements in each drawing.

Figure 1:
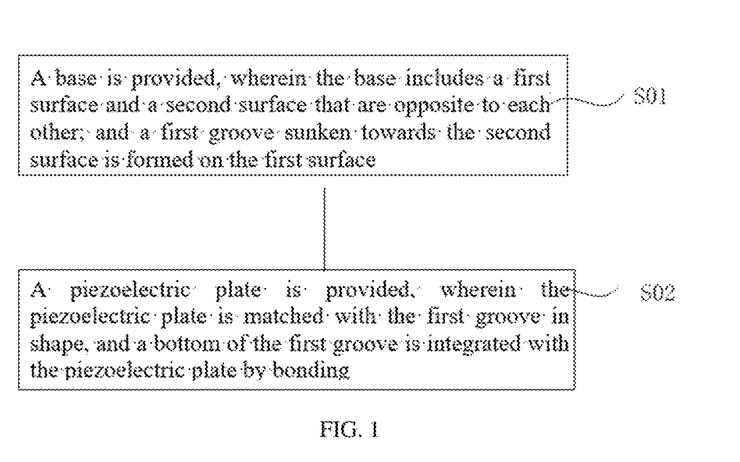
FIG. 1 is a flowchart of steps of a manufacturing method of a composite substrate according to a first embodiment of the present invention.

The present invention provides a manufacturing method of a composite substrate. FIG. 1 is a flowchart of a manufacturing method of a composite substrate according to the present invention. Referring to FIG. 1, the method includes: S01: a base is provided, wherein the base includes a first surface and a second surface that are opposite to each other; and a first groove sunken towards the second surface is formed on the first surface; and S02: a piezoelectric plate is provided and embedded into the first groove, wherein the piezoelectric plate is matched with the first groove in shape, and a bottom of the first groove is integrated with the piezoelectric plate by bonding. By embedding the piezoelectric plate into the first groove, the sidewall of the first groove may obstruct the movement of the piezoelectric plate and prevent the piezoelectric plate from falling off, thereby improving the bonding strength. The first groove may further limit the transverse deformation of the piezoelectric plate, thereby reducing the damage risk of the piezoelectric plate due to the deformation. Additionally, the common practice for manufacturing the SAW resonator at present is to bond the piezoelectric plate on a silicon wafer of the same size. The silicon wafer typically has the specification of 12 inches, 8 inches and 6 inches. If the production line of the silicon wafer is the 8-inch production line, the 8-inch piezoelectric plate is used. The 6-inch piezoelectric plate is applied to the 6-inch production line, i.e., the 6-inch piezoelectric plate cannot be used by the 8-inch production line. The present invention may be applied to different specifications of production lines in a case where the specification of the piezoelectric plate is fixed.

Embodiment 1

The manufacturing method of the composite substrate will be described below with reference to FIG. 2 to FIG. 8. FIG. 2 to FIG. 8 are a structural schematic diagram corresponding to each step of a manufacturing method of a composite substrate according to a first embodiment of the present invention.

Figure 2:
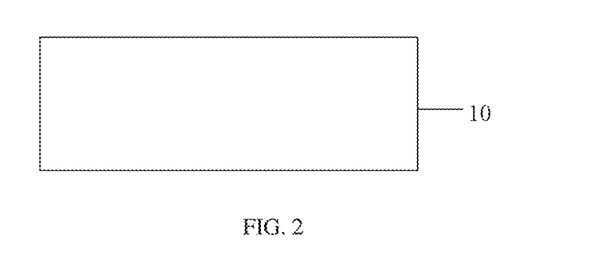
FIG. 2 to FIG. 8 are a structural schematic diagram corresponding to each step of a manufacturing method of a composite substrate according to a first embodiment of the present invention.
Figure 3:
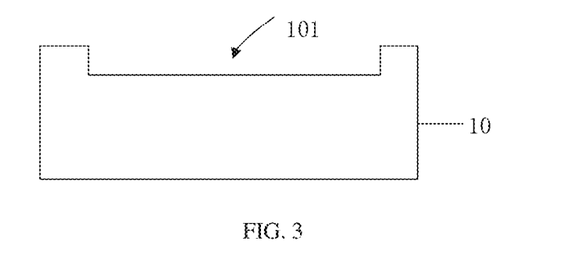

Referring to FIG. 2 and FIG. 3, step S01 is executed: a base 10 is provided, wherein the base 10 includes a first surface and a second surface that are opposite to each other, and a first groove 101 sunken towards the second surface is formed on the first surface.

As a support of the piezoelectric plate, the base 10 has a low coefficient of thermal expansion and can be applied to the semiconductor manufacturing process. In the embodiment, the base is an 8-inch silicon wafer, with a thickness of about 600-800 µm. In other embodiments, the base 10 may further be made of any one of the following materials: sapphire, crystal, germanium (Ge), silicon germanium (SiGe), silicon carbide (SiC), silicon germanium carbide (SiGeC), indium arsenide (InAs), gallium arsenide (GaAs), indium phosphide (InP) or other III/V compound semiconductors. The size may further be 12 inches, 6 inches, 4 inches, etc.

The first groove 101 is configured to accommodate the piezoelectric plate that is embedded therein in the subsequent process. The formed first groove 101 is matched with the piezoelectric plate in size, such that the piezoelectric plate is exactly put into the first groove 101. In the embodiment, the formed first groove 101 is of a circular shape, with a diameter of slightly more than 6 inches. The first groove 101 in the embodiment has a depth of 0.5-10 µm. The depth of the first groove 101 depends on the set thickness of the piezoelectric plate that is needed at last. In the embodiment, the thickness of the ground piezoelectric plate is set as 0.3-10 µm.

In the embodiment, the first groove 101 of the set size is formed on the first surface of the base 10 by etching. The specific etching steps are as follows: the position where the groove is to be etched is perforated with a photoresist in the photoetching process, and then is subjected to wet etching with a special chemical, such that the groove 101 of the set size is etched on the base 10. As the groove is etched layer by layer along lattices, the etched bottom formed at last is very flat, which is helpful to the subsequent bonding process. The etching depth may be accurately controlled by controlling the process time. The etched side can also be very flat, and has the inclination angle of 45° to 90° (the inclination angle refers to the included angle between the sidewall and the bottom of the groove, the groove is perforated with the big top and small bottom, and the inclination angle is expected to be close to 90°). In order that the piezoelectric plate may be embedded into the first groove 101, the size of the bottom of the groove is basically equal to that of the piezoelectric plate.

Referring to FIG. 4 to FIG. 8, step S02 is executed: a piezoelectric plate 20 is provided and embedded into the first groove, wherein the piezoelectric plate 20 is matched with the first groove 101 in shape, and a bottom of the first groove 101 is integrated with the piezoelectric plate 20 by bonding. It is to be noted that the match in shape does not means that the shape is exactly alike, as long as the piezoelectric plate may be embedded into the first groove and both the piezoelectric plate and the first groove are approximately the same in shape. For example, if the side of the first groove has the inclination angle of 90°, both the piezoelectric plate and the first groove are basically the same in shape. If the inclination angle of the side is not 90°, the shapes of the piezoelectric plate and the first groove are not the same but are approximately matched overall, as long as the piezoelectric plate may be embedded into the first groove without too many spaces.

Figure 4:
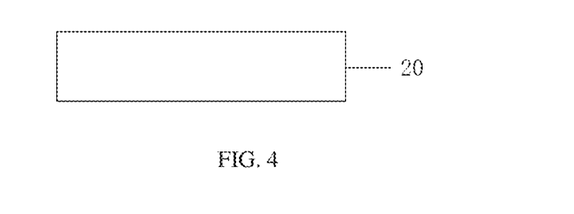

Referring to FIG. 4, in the embodiment, the piezoelectric plate 20 is a 6-inch piezoelectric wafer, with a thickness of about 300-600 µm. The material for the piezoelectric plate 20 includes: piezoelectric crystal or piezoelectric ceramic, for example, piezoelectric materials having the wurtzite-shaped crystal structure such as the lithium phosphate, lithium carbonate, lead zirconate titanate (PZT), lithium niobate (LiNbO3), quartz, potassium niobate (KNbO3), lithium tantalate (LiTaO3), lithium gallate, lithium germanate, titanium germanate or lead zinc titanite and combinations thereof. When the piezoelectric plate 20 is made of the lithium niobate material and is 41° in axial direction and 64° in reference edge direction, the transmission loss of the piezoelectric plate is small. When the piezoelectric plate 20 is made of the lithium tantalate material and is 42° in axial direction and 112° in reference edge direction, the transmission loss of the piezoelectric plate is small. In the embodiment, the piezoelectric plate 20 is monocrystal.

Figure 5:
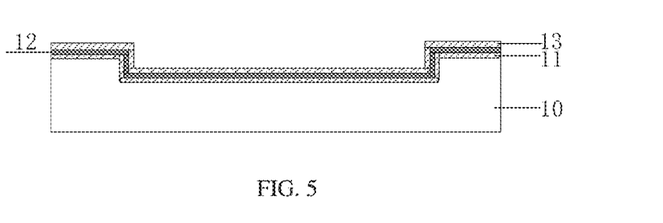
Figure 6:
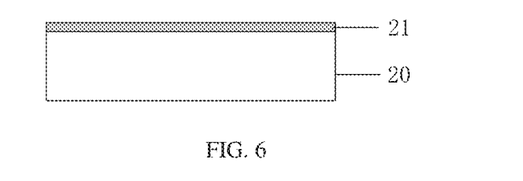
Figure 7:
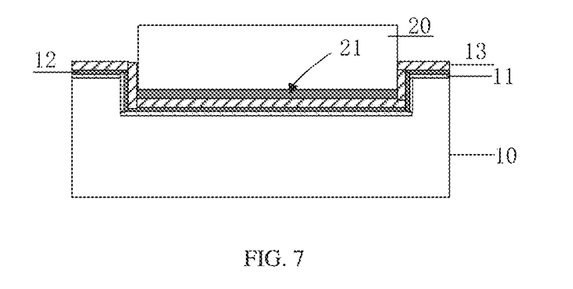

In the embodiment, the bonding uses fusion bonding. The specific bonding method is as follows: referring to FIG. 5, a first bonding layer 13 is formed on the bottom and the sidewall of the first groove. Referring to FIG. 6, a second bonding layer 21 is formed on a bottom (a surface opposite to the first groove) of the piezoelectric plate. Referring to FIG. 7, the piezoelectric plate 20 and the base 10 are bonded together through the first bonding layer 13 and the second bonding layer 21. The bonding layer is respectively formed on the bottom of the first groove 101 and the bottom of the piezoelectric plate 20. The piezoelectric plate 20 is embedded into the first groove 101 through the two-sided bonding layer.

The first bonding layer 13 and the second bonding layer 21 may be made of any material as long as the bonding function can be implemented. For example, the bonding materials include silicon dioxide, polysilicon, silicon nitride or metal. These bonding materials may be directly formed on the bottom of the piezoelectric plate 20 or the first groove 101 by deposition, and thus are applied to the semiconductor process. Furthermore, the silicon dioxide layer may further serve as the temperature compensation layer of the piezoelectric plate. When the first bonding layer 13 is made of a silicon oxide material and the base 10 is a silicon base, the first bonding layer 13 may also be formed by thermal oxidation. In order to meet the bonding requirement, the first, bonding layer 13 and the second bonding layer 21 typically have a thickness of more than 0.3 µm. With the consideration of the process time and cost, the first bonding layer 13 and the second bonding layer 21 should not be too thick, and the first bonding layer 13 and the second bonding layer 21 typically have the thickness of 0.3-1 µm.

In the embodiment, while the first bonding layer 13 is formed, the first bonding layer is also formed on an upper surface of the base 10 other than the first groove. The first bonding layer on this part may be removed, and may also be retained, which may depend on the actual process demand. In the embodiment, the bonding layer is respectively formed on the base and the piezoelectric plate. However, it may also be appropriate that the second bonding layer is formed only on the piezoelectric plate, and the base is made of a material easily bonded with the second bonding layer, such as the silicon. It may also be appropriate that the first bonding layer is formed on the base, and the first bonding layer is made of a material easily bonded with the piezoelectric plate. Therefore, the fusion bonding in the present invention includes: a first bonding layer is formed in the first groove and/or a second bonding layer is formed on a bottom of the piezoelectric plate, and the base and the piezoelectric plate are bonded through the bonding layer. The fusion bonding is not limited to the double-layer bonding shown by the embodiment in the figure. In the present invention, the bonding for the base and the piezoelectric plate is not limited to the above fusion bonding, and may further be covalent bonding or adhesive bonding. When the covalent bonding is used, the bottom of the piezoelectric plate and the bottom of the first groove need to be treated in flatness, such that the surfaces reach the required smoothness, and the bottom of the piezoelectric plate and the bottom of the first groove can be integrated together by virtue of a molecular force therebetween. When the adhesive bonding is used, by forming an adhesive such as the epoxy resin adhesive on the bottom of the piezoelectric plate 20 and/or the first groove 101, the piezoelectric plate 20 is adhered on the bottom of the first groove 101, Additionally, in the embodiment, before the first bonding layer 13 is formed on the bottom of the first groove 101, the manufacturing method further includes that a stress buffering layer 11 and a stress compensation layer 12 are formed. The stress buffering layer and the stress compensation layer are formed on the bottom of the first groove, the stress compensation layer is configured to offset a stress of the bonding layer, and the stress buffering layer solves the problem of a large difference between stresses of the stress compensation layer and the base. If the stress between the base 10 and the piezoelectric plate 20 is not buffered and offset, the stress difference therebetween tends to be large to cause warpage of the base 10. In the embodiment, at least either the stress buffering layer 11 or the stress compensation layer 12 also serves as an acoustic wave reflection layer with an acoustic wave reflection function. When the acoustic wave in the piezoelectric plate is transmitted to the stress buffering layer 11 or the stress compensation layer 12, the acoustic wave is reflected to the piezoelectric plate to reduce the energy loss of the acoustic wave.

The material for the base 10 uses the silicon, the material for the stress buffering layer 11 includes the silicon dioxide, and the material for the stress compensation layer 12 includes the silicon nitride, silicon carbide or boron nitride, or metal material such as molybdenum, aluminum, tungsten or thallium. The stress compensation layer 12 made of the silicon nitride, silicon carbide or boron nitride, or molybdenum, aluminum, tungsten, thallium or potassium material further has the acoustic wave reflection function, and may serve as the acoustic wave reflection layer. The stress buffering layer and the stress compensation layer may respectively have a thickness of 0.08-1 μm, and the specific thickness value may be adjusted according to the stress compensation goal and acoustic reflection requirement. In the present invention, it may also be appropriate that the stress buffering layer and the stress compensation layer are not formed but the acoustic wave reflection layer is formed on the bottom of the first groove and or the bottom of the piezoelectric plate. The acoustic wave reflection layer is a single film layer or a plurality of film layers. The material for the acoustic wave reflection layer at least includes one of the silicon carbide, silicon nitride, molybdenum and aluminum. It may also be appropriate that not only the stress buffering layer and the stress compensation layer are formed but the acoustic wave reflection layer is also formed. Before the bonding, the acoustic wave reflection layer is first formed on the bottom of the first groove, and then the stress buffering layer and the stress compensation layer are formed; or, the stress buffering layer and the stress compensation layer are first formed on the bottom of the first groove, and then the acoustic wave reflection layer is formed.

In the embodiment, after the above bonding layer, stress buffering layer and the stress compensation layer are formed, the manufacturing method further includes: an ion beam trimming process is respectively performed on each layer of thin film, such that the surface for each layer of thin film is smooth and flat, which may increase the bonding strength between the base and the piezoelectric plate in the subsequent bonding process. Additionally, in order to improve the bonding strength, the manufacturing method further includes a step of at least performing surface activation on the first bonding layer 13 or the second bonding layer 21. Measures for the surface activation include any one of ozone water treatment, Ultraviolet (UV) ozone treatment, plasma treatment and ion beam treatment.

Referring to FIG. 7, perpendicular optical alignment may be performed through an alignment device, such that the piezoelectric plate 20 is embedded into the first groove 101; and then, the first bonding layer 13 and the second bonding layer 21 are bonded. It is to be noted that, in the embodiment of the present invention, by embedding the piezoelectric plate 20 into the first groove 101, the sidewall of the first groove 101 has a limitation effect on the movement of the piezoelectric plate 20, thereby reinforcing the bonding strength. When the piezoelectric plate 20 is thinned in the subsequent process, the piezoelectric plate 20 is not stripped from the base 10. Furthermore, in the process of forming the device such as the SAW resonator on the composite substrate, thanks to double assurance of the clamping of the groove and the side bonding, the piezoelectric plate is not stripped from the base 10 for the influences of each process such as the high-temperature process. Meanwhile, as the piezoelectric plate 20 is located in the first groove 101, and the sidewall of the first groove 101 limits the transverse deformation of the piezoelectric plate 20, such that the damage problem of the piezoelectric plate 20 due to the transverse deformation is improved (for example, due to the temperature influence). Additionally, the first bonding layer 13, the stress buffering layer 11 and the stress compensation layer 12 are also formed on the sidewall of the first groove 101. By forming the protective layer and the acoustic wave reflection layer for the sidewall of the piezoelectric plate 20, the damage of the piezoelectric plate and the leakage of the acoustic wave are prevented.

Figure 8:
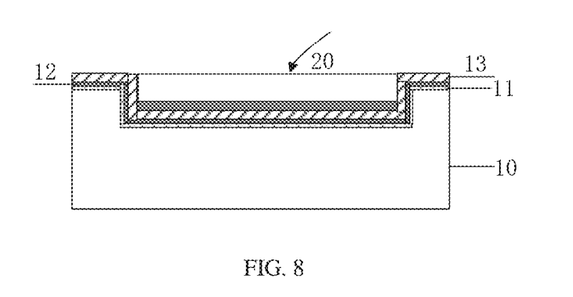

Referring to FIG. 8, a thinning process is performed on a top of the piezoelectric plate 20, such that the piezoelectric plate 20 reaches a set thickness. In the embodiment, the thinning process includes the following steps:

1. The piezoelectric plate 20 is thinned to 25-35 μm by mechanically grinding an upper surface of the piezoelectric plate 20. The upper surface of the piezoelectric plate 20 is roughly ground with a physico-mechanical grinding device. The requirement on the grinding precision is not high and may be achieved with the conventional grinding device. The device with a fast grinding speed may be selected to reduce the grinding time. 2. The piezoelectric plate 20 is thinned to 4-6 µm with chemo-mechanical rough grinding. The upper surface of the piezoelectric plate 20 is finely ground with Chemo-Mechanical Polishing (CMP). 3. The piezoelectric plate 20 is thinned to 0.6-0.7 µm with the CMP The CMP is continuously used to grind the upper surface of the piezoelectric plate 20 more finely. In the embodiment, upon the completion of the above 3 steps of grinding, the manufacturing method further includes: the upper surface of the piezoelectric plate 20 is trimmed through an ion beam trimming process. The trimmed piezoelectric plate 20 has a surface roughness index (the height difference between the thickest part and the thinnest part) of less than 10 nm. The ion beam trimming may be nanoscale, which may not only trim the overall surface of the piezoelectric plate 20, but also adjust the local height. In the embodiment, the ion beam trimming process uses the following parameters: the beam current is 25-200 mA, and the scanning time for the whole piece of wafer is 30 s to 10 min.

In the embodiment, after the upper surface of the piezoelectric plate 20 is trimmed, the manufacturing method further includes: the piezoelectric plate 20 is annealed with a furnace tube or a laser to repair lattice damage of the piezoelectric plate 20. The furnace tube annealing includes: the base 10 is put into a high-temperature furnace, such as the horizontal furnace, vertical furnace and Rapid Thermal Process (RTP), and heated for 2-5 min at 1100-1200° C. The laser annealing includes: the 0.8-0.15 j/cm2 pulse laser is acted on the piezoelectric plate for 30-600 s, such that the piezoelectric plate 20 is locally heated to 1100-1300° C. to be in a molten state, for the sake of recrystallization to repair the damage. The annealed piezoelectric plate 20 has better piezoelectric characteristics. The difference between the two annealing treatments lies in: the first annealing treatment heats the base 10 and the piezoelectric plate 20 overall, while the second annealing treatment may only heat the surface of the piezoelectric plate.

In the embodiment, when the first groove has the inclination angle and there is a large gap between the piezoelectric plate and the side of the first groove, a filling layer may be deposited first after the base and the piezoelectric plate are bonded. The filling layer fills the gap between the piezoelectric plate and the first groove. The filling layer may only fill the gap, and may also cover the top (the surface opposite to the base) of the piezoelectric plate and the surface part of the base before the first groove. When the filling layer covers the top (the surface opposite to the base) of the piezoelectric plate and the surface part of the base before the first groove, and when the piezoelectric plate is thinned, the filling layer on the top of the piezoelectric plate is thinned first, and then the piezoelectric plate is thinned to the set thickness. Whether the filling layer on the base other than the first groove is thinned may be determined according to the actual demand. Or, it may also be appropriate that the piezoelectric plate is thinned to a certain thickness first, and then the above-described process of forming the filling layer is performed. The filling layer may use the dielectric layer such as the silicon dioxide. By this time, the silicon dioxide may serve as the temperature compensation layer. The filling layer may also use the dielectric layer with the stress buffering effect to relieve the stress between the piezoelectric plate and the base.

Embodiment 2

The differences between the embodiment and the above embodiment lie in: a protrusion is formed on the bottom of the first groove, and a second groove is formed on a bottom of the piezoelectric plate; or, the second groove is formed on the bottom of the first groove, and the protrusion is formed on the bottom of the piezoelectric plate; the protrusion and the second groove are matched in shape, and positioned in a non-device region of the composite substrate; and when the piezoelectric plate is embedded into the first groove, the second groove and the protrusion are clamped together.

Figure 9A:
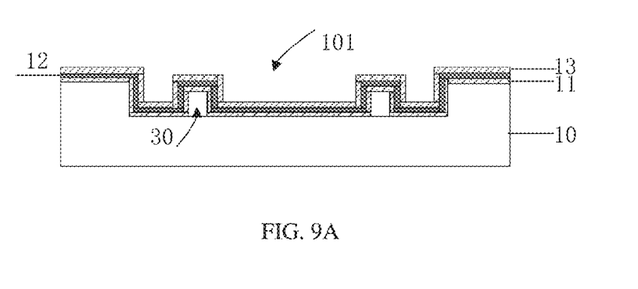
Figure 9B:
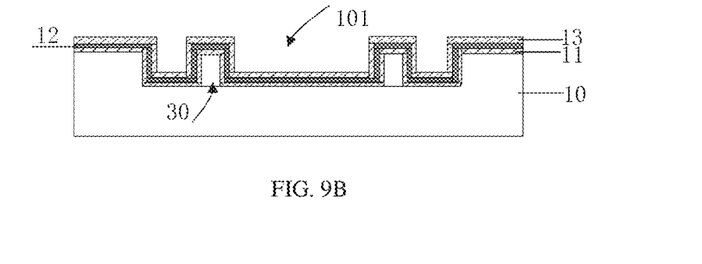
Figure 10:
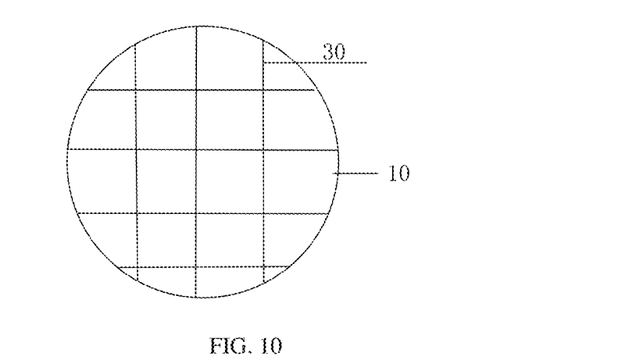
Figure 11:
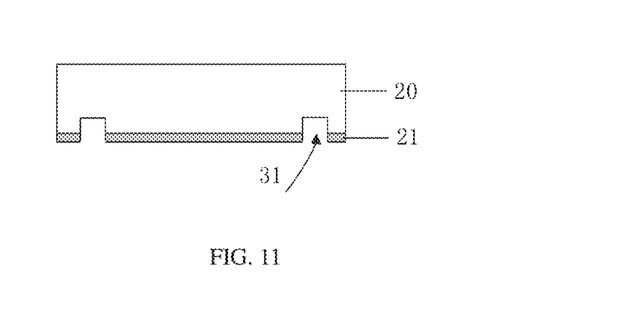
Figure 12:
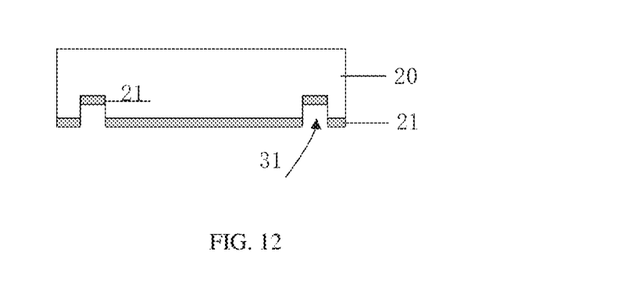

Specifically, referring to 9A to FIG. 12, before the first bonding layer 13 is formed, the manufacturing method further includes: a plurality of protrusions 30 are formed on the bottom of the first groove 101; and the protrusion 30 may be lower than the first surface, or higher than the first surface. Referring to FIG. 9A, the protrusion 30 is lower than the first surface. Referring to FIG. 9B, the protrusion 30 is flush with the first surface.

Referring to FIG. 11 and FIG. 12, before or after the second bonding layer 21 is formed, the manufacturing method further includes: a plurality of second grooves 31 matched with the protrusion 30 are formed on a surface, opposite to the first groove 101, of the piezoelectric plate 20. When the piezoelectric plate 20 is embedded into the first groove 101, the second groove 31 and the protrusion 30 are clamped together. Other steps are the same as the first embodiment. Referring to FIG. 11, the second groove 31 is matched with the protrusion 30 in shape, and slightly greater than the protrusion 30 in size, as long as the protrusion may be accommodated exactly. The second groove 31 may be formed on the bottom of the piezoelectric plate 20 with the dry etching process. When there is a need to form the second bonding layer 21 on the bottom of the piezoelectric plate 20, the second groove 31 may be formed before the formation of the second bonding layer 21, and may also be formed after the formation of the second bonding layer 21. Referring to FIG. 11, when the second groove 31 is formed after the formation of the second bonding layer 21, there is no second bonding layer on the bottom of the second groove 31. Referring to FIG. 12, when the second groove 31 is formed before the formation of the second bonding layer 21, the second bonding layer 21 is also formed on the bottom and side (not shown) of the second groove 31. When the first bonding layer, the stress buffering layer and the stress compensation layer are formed on the top of the protrusion or the first bonding layer is formed on the bottom of the second groove, the protrusion with the required height and the second groove with the required depth may be formed according to thicknesses of different film layers and the thickness of the piezoelectric plate to be formed.

Figure 13:
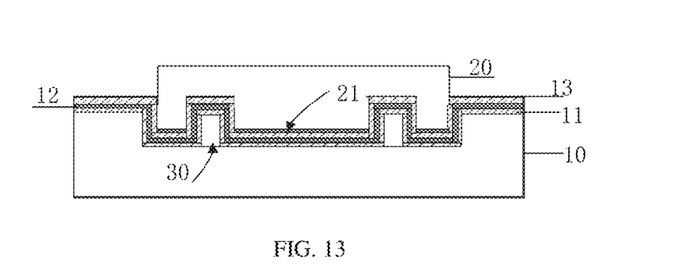

Referring to FIG. 9A and FIG. 9B, the method for forming the protrusion 30 includes: after the first groove is etched, the bottom of the first groove is patterned with a photoetching process to form the protrusion 30, or, after the first groove is etched, a dielectric layer is deposited on the bottom of the first groove, and the dielectric layer is etched to form the protrusion 30. Then, the stress buffering layer, the stress compensation layer and the first bonding layer are formed. With the protrusion 30, the bonding area between the piezoelectric plate and the base 10 is increased, and thus the bonding strength therebetween may be reinforced. Referring to FIG. 9B, when the protrusion 30 is flush with the first surface, the method for forming the protrusion 30 may further include: the base 10 is patterned to form the first groove 101 with the protrusion 30. By this time, the protrusion 30 may reinforce the bonding strength between the piezoelectric plate and the base. When the protrusion 30 is higher than or flush with the first surface of the base 10, the protrusion 30 may serve as a grinding stop layer. Referring to FIG. 9B and FIG. 13, the top of the piezoelectric plate is higher than the base; and after the piezoelectric plate and the base are bonded, the manufacturing method further includes: a grinding and thinning process is performed on the piezoelectric plate 20 (referring to FIG. 14). The protrusion 30 is formed on the bottom of the first groove, the protrusion 30 serves as a grinding stop layer of the grinding and thinning process, or, the grinding stop layer is formed on a top of the protrusion 30. There are two cases that the protrusion 30 serves as the grinding stop layer. In the first case, the material of the protrusion is different from that of the base; after the dielectric layer such as the silicon nitride is formed by the deposition, the dielectric layer is photoetched to form the protrusion; and by this time, the protrusion may serve as the grinding stop layer independently. In the second case, as the stress buffering layer and the stress compensation layer are further formed after the formation of the protrusion, the stress buffering layer or the stress compensation layer located on the top of the protrusion may serve as the grinding stop layer. For example, the stress compensation layer may select the silicon nitride, and the stress compensation layer may also serve as the grinding stop layer.

Figure 14:
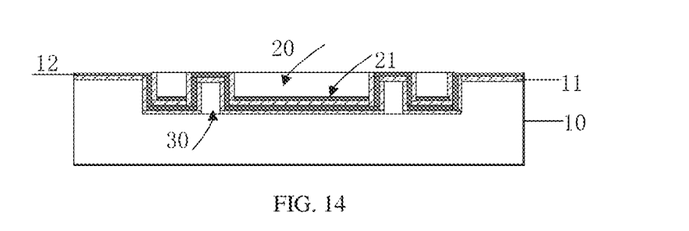

Referring to FIG. 14, the second case is used in the embodiment. The stress compensation layer selects the silicon nitride, and may serve as the grinding and thinning stop layer for the piezoelectric plate. Referring to FIG. 10, a diagram of an arrangement of the protrusion is shown. The protrusion 30 is arranged into a grid form. The protrusion 30 is formed on the bottom of the first groove. The protrusion 30 is made of a dielectric layer or silicon. The protrusion is distributed on a cutting channel, and is of a strip structure. The piezoelectric plate is fragile and is prone to damage during cutting. In the embodiment, the protrusion made of the dielectric layer or the silicon material is distributed on the cutting channel, so the piezoelectric material is prevented from being cut but the dielectric material such as the silicon nitride is cut, and thus the damage problem of the piezoelectric substrate during cutting may be solved. In the embodiment, the top of the protrusion is higher than or flush with the first surface, and the top of the protrusion is not covered by the piezoelectric plate. In this way, the piezoelectric material may be completely prevented from being cut when the composite substrate is cut. Certainly, in the present invention, the distribution of the protrusion is not limited to the form shown in FIG. 10. The protrusion may also be distributed dispersively in a punctated form to reinforce the bonding strength. In the present invention, the stress buffering layer, the stress compensation layer, and/or the acoustic wave reflection layer may also be formed in the first groove before the protrusion is formed on the bottom of the first groove.

The difference between the second embodiment and the first embodiment mainly focuses on whether the protrusion and the second groove are formed, and other steps are the same as the first embodiment and will be elaborated herein.

Embodiment 3

The third embodiment of the present invention further provides a composite substrate. FIG. 8 is a structural schematic diagram of a composite substrate according to an embodiment of the present invention. Referring to FIG. 8, the composite substrate includes: a base 10, wherein the base 10 includes a first surface and a second surface that are opposite to each other; and a first groove sunken towards the second surface is provided on the first surface; and a piezoelectric plate 20, wherein the piezoelectric plate 20 is embedded into the first groove and bonded with the base 10 together, and a top of the piezoelectric plate 20 is higher than the first surface or forms a plane with a surface of the composite substrate. In the embodiment, the surface of the composite substrate is the plane. The bonding includes one of covalent bonding, adhesive bonding and fusion bonding. Descriptions on the specific bonding may refer to relevant contents in the method part.

Still referring to FIG. 8, in the embodiment, a first bonding layer is formed on a bottom and a sidewall of the first groove, and a second bonding layer is disposed on a surface, opposite to the first groove, of the piezoelectric plate. In the embodiment, between the first bonding layer and the first groove, the composite substrate further includes: a stress buffering layer and a stress compensation layer. The stress compensation layer is positioned between the stress buffering layer and the first bonding layer. The materials, thicknesses, distribution positions and effects for the bonding layer, the stress buffering layer and the stress compensation layer in the method part of the first embodiment may be quoted herein, and will not be elaborated herein. In the present invention, the fusion bonding is not limited to the above descriptions, as long as the following requirements may be met: the first bonding layer is disposed on the bottom and the sidewall of the first groove; and/or, the second bonding layer is disposed on the surface, opposite to the first groove, of the piezoelectric plate. In other embodiments of the present invention, an acoustic wave reflection layer is provided between the piezoelectric plate and the base. The acoustic wave reflection layer may be positioned on an upper surface or a lower surface of each of the stress buffering layer and the stress compensation layer or between the stress buffering layer and the stress compensation layer, or, the stress buffering layer and the stress compensation layer that are sequentially located in the first groove are provided between the piezoelectric plate and the base, and at least either the stress buffering layer or the stress compensation layer serves as the acoustic wave reflection layer. The descriptions on related contents in the method part may be quoted herein.

Referring to FIG. 9A and FIG. 9B, in another embodiment, the first groove 101 further includes a plurality of protrusions 30 inside. Referring to FIG. 11 and FIG. 12, a plurality of second grooves 31 matched with the protrusion 30 are included on the bottom of the piezoelectric plate 20. Referring to FIG. 13 and FIG. 14, the protrusion 30 is clamped in the second groove. With the protrusion and the second groove, the bonding strength between the piezoelectric plate and the base may be increased on one hand; and on the other hand, when the top of the piezoelectric plate is thinned, the protrusion serves as the grinding stop layer, which is helpful to control the thickness of the piezoelectric plate. In the embodiment, the arrangement of the protrusion and the second groove is not limited to the manners set in FIG. 9A, FIG. 9B, FIG. 11 and FIG. 12, and may further be that the protrusion is provided on the bottom of the piezoelectric plate and the second groove is provided on the bottom of the first groove, i.e., in the present invention, either the bottom of the first groove or the bottom of the piezoelectric plate is provided with a plurality of protrusions, and the other is provided with the second groove matched with the protrusion, the protrusion is clamped in the second groove, and the protrusion and the second groove are located in a non-device region of the composite substrate. When the protrusion is formed on the bottom of the first groove, the protrusion is made of a dielectric layer or polysilicon, and the protrusion is distributed on a cutting channel, and is of a strip structure. A top of the protrusion is higher than or flush with the first surface, and the top of the protrusion is not covered by the piezoelectric plate, which may solve the damage problem of the piezoelectric plate during cutting. Related contents on the material, distribution, advantage and the like of the protrusion in the method part may be quoted herein. In another embodiment, the base further includes an acoustic reflection structure, and the acoustic reflection structure includes a cavity or a Bragg reflection layer. The acoustic reflection structure is configured to reflect the longitudinal acoustic wave of the piezoelectric plate that is propagated to the base to the piezoelectric plate, thereby reducing the energy loss of the acoustic wave.

Embodiment 4

The fourth embodiment of the present invention further provides a manufacturing method of an SAW resonator, which includes the following steps.

A composite substrate is provided; and a first IDT and a second IDT are formed on a top of a piezoelectric plate. In an embodiment, the composite substrate is provided with an acoustic reflection structure, and the first IDT and the second IDT are provided above a region enclosed by the acoustic reflection structure. In an embodiment, the acoustic reflection structure is a first cavity. Forming the first cavity includes: the first cavity is formed on a second surface of a base by etching, a bottom of the first cavity exposing a second surface of the piezoelectric plate or a second bonding layer or a first bonding layer; and a second substrate is provided, the second substrate being bonded on the second surface of the base and sealing the first cavity. Before the first cavity is formed, the manufacturing method further includes: the second surface of the base is thinned, such that the base has a thickness of 0.5-5 μm. The second substrate has a thickness of 300-500 μm. In another embodiment, the acoustic reflection structure is a Bragg reflection layer. Forming the Bragg reflection layer includes: a second cavity is formed on a second surface of a base by etching, a bottom of the second cavity exposing a bottom of the piezoelectric plate or a first bonding layer or a first bonding layer; and at least two groups of staggered first acoustic impedance layers and second acoustic impedance layers are formed on the bottom of the second cavity, the hardness of the first acoustic impedance layer is higher than that of the second acoustic impedance layer. A material for the first acoustic impedance layer is composed of metal including tungsten or a dielectric including silicon carbide and diamond, and a material for the second acoustic impedance layer includes silicon oxide or silicon nitride.

The embodiments of the present invention further provides an SAW resonator, which includes the above composite substrate.

It should be noted that each embodiment in the specification is described by a relevant mode, the same or similar part between each embodiment may refer to each other, and each embodiment focuses on the difference from other embodiments. In particular, for the structural embodiment which is basically similar to the method embodiment, the description is relatively simple, and the relevant points are referenced to the partial description of the method embodiment.

The above description is only the description of the preferred embodiment of the present invention and does not constitute any limitation to the scope of the present invention. Any changes and modifications made by those of ordinary skill in the field of the present invention according to the content disclosed above shall fall within the protection scope of the claims.

What is claimed is:

1. A manufacturing method of a composite substrate of an acoustic wave resonator, comprising:
   providing a base, wherein the base comprises a first surface and a second surface that are opposite to each other; and
   a first groove sunken towards the second surface is formed on the first surface; and
   providing a piezoelectric plate and embedding the piezoelectric plate into the first groove, wherein the piezoelectric plate is matched with the first groove in shape, and a bottom of the first groove is integrated with the piezoelectric plate by bonding;
   forming a protrusion on the bottom of the first groove, and forming a second groove on a bottom of the piezoelectric plate; or, forming the second groove on the bottom of the first groove, and forming the protrusion on the bottom of the piezoelectric plate,
   wherein the protrusion and the second groove are matched in shape, and positioned in a non-device region of the composite substrate; and
   wherein when the piezoelectric plate is embedded into the first groove, the second groove and the protrusion are clamped together.

2. The manufacturing method according to claim 1, wherein the bonding comprises one of covalent bonding, adhesive bonding and fusion bonding;
   wherein the adhesive bonding comprises: forming an adhesive on the bottom of the first groove and/or the piezoelectric plate, and bonding the base and the piezoelectric plate with the adhesive; and
   the fusion bonding comprises: forming a first bonding layer in the first groove and/or forming a second bonding layer on the bottom of the piezoelectric plate, and bonding the base and the piezoelectric plate through the bonding layer;
   wherein a material for the first bonding layer and/or the second bonding layer comprises: silicon oxide, nitrogen oxide, polysilicon or metal.

3. The manufacturing method according to claim 1, before the bonding, further comprising: forming an acoustic wave reflection layer on the bottom of the first groove and/or a bottom of the piezoelectric plate;
   the acoustic wave reflection layer is a single film layer or a plurality of film layers;
   a material for the acoustic wave reflection layer at least comprises one of silicon carbide, silicon nitride, boron nitride, molybdenum, aluminum, tungsten, thallium and potassium.

4. The manufacturing method according to claim 1, before the bonding, further comprising: forming a stress buffering layer on the bottom of the first groove.

5. The manufacturing method according to claim 4, further comprising: forming a stress compensation layer on the stress buffering layer;
   the base is a silicon base, the stress buffering layer is made of silicon oxide, and the stress compensation layer is made of silicon nitride.

6. The manufacturing method according to claim 5, wherein the stress buffering layer and the stress compensation layer respectively have a thickness of 0.08-1 μm; and/or
   the first bonding layer or the second bonding layer has a thickness of 0.3-1 μm.

7. The manufacturing method according to claim 1, before the bonding, first forming an acoustic wave reflection layer on the bottom of the first groove, and then forming a stress buffering layer and a stress compensation layer;

or, first forming the stress buffering layer and the stress compensation layer on the bottom of the first groove, and then forming the acoustic wave reflection layer;

or, forming the stress buffering layer and the stress compensation layer in the first groove, at least either the stress buffering layer or the stress compensation layer serving as the acoustic wave reflection layer.

8. The manufacturing method according to claim 1, wherein the method for forming the protrusion comprises: patterning the bottom of the first groove or the bottom of the piezoelectric plate to form the protrusion;

or, forming a dielectric layer or a polysilicon layer on the bottom of the first groove or the bottom of the piezoelectric plate, and etching the dielectric layer or the polysilicon layer to form the protrusion.

9. The manufacturing method according to claim 1, wherein the protrusion is formed on the bottom of the first groove, and before or after the protrusion is formed, the stress buffering layer and the stress compensation layer, and/or the acoustic wave reflection layer are formed in the first groove;

a top of the piezoelectric plate is higher than the base, and after the piezoelectric plate and the base are bonded, the manufacturing method further comprises: performing a grinding and thinning process on the piezoelectric plate; and the protrusion is formed on the bottom of the first groove, the protrusion serves as a grinding stop layer of the grinding and thinning process, or, the grinding stop layer is formed on a top of the protrusion;

the protrusion is formed on the bottom of the first groove, the protrusion is made of a dielectric layer or polysilicon, and the protrusion is distributed on a cutting channel and is of a strip structure.

10. The manufacturing method according to claim 9, wherein the top of the protrusion is higher than or flush with the first surface, and the top of the protrusion is not covered by the piezoelectric plate.

11. The manufacturing method according to claim 1, wherein after the piezoelectric plate is integrated with the first groove, a top of the piezoelectric plate is flush with the first surface or higher than the first surface.

12. The manufacturing method according to claim 1, wherein a top of the piezoelectric plate is higher than the first surface, and the manufacturing method further comprises: thinning an upper surface of the piezoelectric plate to form a plane with an upper surface of the composite substrate, the thinning process comprising the following steps:

thinning the piezoelectric plate to 25-35 μm by mechanically grinding the top of the piezoelectric plate;

thinning the piezoelectric plate to 4-6 μm with chemomechanical rough grinding;

thinning the piezoelectric plate to 0.6-0.7 μm with Chemo-Mechanical Polishing (CMP); and trimming the upper surface of the piezoelectric plate through an ion beam trimming process, the trimmed piezoelectric plate having a surface thickness uniformity of less than 2%;

wherein after performing the ion beam trimming on the top of the piezoelectric plate, further comprising:

annealing the piezoelectric plate with a furnace tube or a laser to repair lattice damage of the piezoelectric plate.

* * * * *